(12) United States Patent
Sferlazzo et al.

(10) Patent No.: US 8,865,259 B2
(45) Date of Patent: Oct. 21, 2014

(54) METHOD AND SYSTEM FOR INLINE CHEMICAL VAPOR DEPOSITION

(75) Inventors: Piero Sferlazzo, Marblehead, MA (US); Thomas Michael Lampros, Cambridge, NY (US)

(73) Assignee: Singulus MOCVD GmbH I.GR., Kahl-AM Main (DE)

( * ) Notice: Subject to any disclaimer, the term of this patent is extended or adjusted under 35 U.S.C. 154(b) by 289 days.

(21) Appl. No.: 13/156,465

(22) Filed: Jun. 9, 2011

(65) Prior Publication Data
US 2011/0262628 A1  Oct. 27, 2011

Related U.S. Application Data

(63) Continuation-in-part of application No. 12/767,112, filed on Apr. 26, 2010.

(51) Int. Cl.
| | | |
|---|---|---|
| *H01L 31/18* | (2006.01) | |
| *H01L 31/20* | (2006.01) | |
| *C23C 16/54* | (2006.01) | |
| *C23C 16/40* | (2006.01) | |
| *H01L 31/0749* | (2012.01) | |
| *H01L 31/032* | (2006.01) | |
| *C23C 16/30* | (2006.01) | |

(52) U.S. Cl.
CPC .............. *C23C 16/54* (2013.01); *Y02E 10/541* (2013.01); *H01L 31/18* (2013.01); *H01L 31/206* (2013.01); *C23C 16/545* (2013.01); *C23C 16/407* (2013.01); *H01L 31/0749* (2013.01); *H01L 31/0322* (2013.01); *C23C 16/306* (2013.01)
USPC .................... 427/255.23; 427/248.1; 118/719

(58) Field of Classification Search
None
See application file for complete search history.

(56) References Cited

U.S. PATENT DOCUMENTS 4,048,955 A * 9/1977 Anderson ...................... 118/719
4,874,631 A * 10/1989 Jacobson et al. .............. 427/578
(Continued)

FOREIGN PATENT DOCUMENTS

JP       05295551 A    11/1993
KR    100190801 B1     6/1999
(Continued)

OTHER PUBLICATIONS

Nelson, Shelby F. et al.; "Spatial Atomic Layer Deposition of Zinc Oxide: An Alternative Approach to Printed Electronics", Eastman Kodak Company, 2009, 31 pgs.; http://acswebcontent.acs.org/organicmicroelectronic/presentations/Nelson_Shelby.pdf.

(Continued)

*Primary Examiner* — Mandy Louie
(74) *Attorney, Agent, or Firm* — Schmeiser, Olsen & Watts LLP

(57) ABSTRACT

Disclosed are an inline chemical vapor deposition method and system for fabricating a device. The method includes transporting a web or discrete substrate through a deposition chamber having a plurality of deposition modules. A buffer layer, a window layer and a transparent conductive layer are deposited onto the substrate during passage through a first deposition module, a second deposition module and a third deposition module, respectively. Advantageously, the steps for generating the buffer layer, window layer and transparent conductive layer are performed sequentially in a common vacuum environment of a single deposition chamber and the use of a conventional chemical bath deposition process to deposit the buffer layer is eliminated. The method is suitable for the manufacture of different types of devices including various types of solar cells such as copper indium gallium diselenide solar cells.

10 Claims, 11 Drawing Sheets

(56) References Cited

U.S. PATENT DOCUMENTS

| | | | |
|---|---|---|---|
| 6,022,414 A * | 2/2000 | Miller et al. | 118/718 |
| 6,338,872 B1 * | 1/2002 | Yoshino et al. | 427/248.1 |
| 6,521,048 B2 | 2/2003 | Miller et al. | |
| 7,194,197 B1 * | 3/2007 | Wendt et al. | 392/389 |
| 7,413,982 B2 | 8/2008 | Levy | |
| 7,456,429 B2 | 11/2008 | Levy | |
| 7,851,380 B2 | 12/2010 | Nelson et al. | |
| 2001/0050057 A1 * | 12/2001 | Yonezawa et al. | 118/718 |
| 2002/0139303 A1 | 10/2002 | Yamazaki et al. | |
| 2004/0049308 A1 * | 3/2004 | Evers et al. | 700/121 |
| 2004/0063320 A1 * | 4/2004 | Hollars | 438/689 |
| 2005/0161077 A1 | 7/2005 | Okabe et al. | |
| 2007/0281089 A1 | 12/2007 | Heller et al. | |
| 2008/0213477 A1 * | 9/2008 | Zindel et al. | 427/255.28 |
| 2009/0017190 A1 | 1/2009 | Sferlazzo et al. | |
| 2010/0120233 A1 * | 5/2010 | He | 438/478 |
| 2010/0221426 A1 | 9/2010 | Sferlazzo et al. | |
| 2010/0291308 A1 | 11/2010 | Sferlazzo et al. | |
| 2010/0310766 A1 | 12/2010 | Armour et al. | |
| 2010/0310769 A1 | 12/2010 | Armour et al. | |

FOREIGN PATENT DOCUMENTS

| | | | | |
|---|---|---|---|---|
| KR | 100895223 B1 | | 5/2009 | |
| WO | WO2009033503 | * | 3/2009 | C23C 14/06 |

OTHER PUBLICATIONS

International Search Report and Written Opinion in related international application No. PCT/US2011/031509, dated Nov. 25, 2011. 8 pages.

Non-Final Office Action in related U.S. Appl. No. 12/767,112, mailed on Mar. 21, 2013; 18 pages.

Final Office Action in related U.S. Appl. No. 12/767,112, mailed on Jul. 24, 2013; 12 pages.

International Preliminary Report on Patentability in related international patent application No. PCT/US12/38256, mailed on Dec. 27, 2013; 7 pages.

* cited by examiner

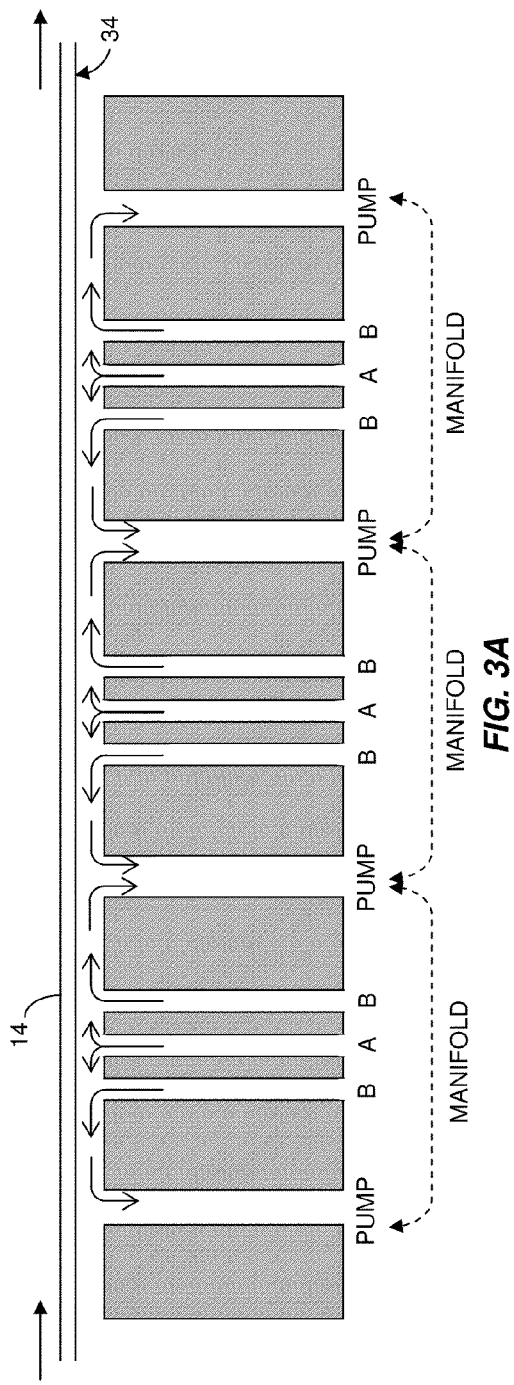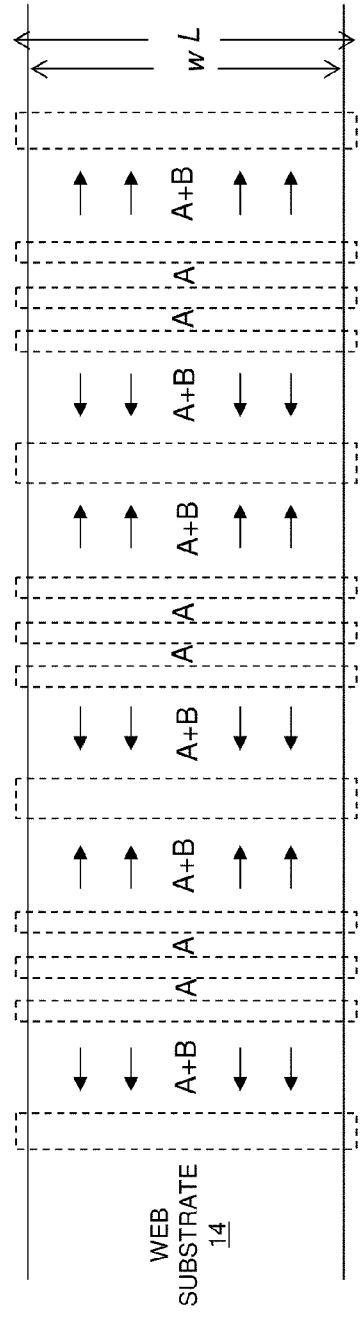
FIG. 3A
FIG. 3B

METHOD AND SYSTEM FOR INLINE CHEMICAL VAPOR DEPOSITION

RELATED APPLICATION

This application is a continuation-in-part application of U.S. patent application Ser. No. 12/767,112, titled "Inline Chemical Vapor Deposition System" and filed Apr. 26, 2010.

FIELD OF THE INVENTION

The invention relates generally to a system and method for chemical vapor deposition. More particularly, the invention relates to a chemical vapor deposition system for inline processing of web substrates and discrete element substrates.

BACKGROUND OF THE INVENTION

Chemical vapor deposition (CVD) is a process used to deposit semiconductor, dielectric, metallic and other thin films onto a surface of a substrate. In one common CVD technique, one or more precursor molecules, each in a gas phase, are introduced into a process chamber that includes the substrate. The reaction of these precursor gases at the surface of the substrate is initiated or enhanced by adding energy. For example, energy can be added by increasing the surface temperature or by exposing the surface to a plasma discharge or ultraviolet (UV) radiation source.

The quality of a film deposited by a CVD reaction occurring in the gas phase depends significantly on the uniformity of the precursor gas flows. Non-uniform gas flow near the substrate surface can yield unsatisfactory film uniformity and can lead to shadowing artifacts due to features on the surface, such as steps and vias. High volume processing of wafers and other discrete substrates, and high speed processing of web substrates in roll-to-roll deposition systems are limited by known systems and methods for CVD processing, and are often costly to operate based on material utilization and other factors.

Atomic layer deposition (ALD) is another technique in which a film is deposited onto a surface of a substrate. According to the ALD process, a first precursor gas flow is used to react with the surface to generate a monolayer. The first precursor gas flow is terminated and a second precursor gas flow is then used to generate another monolayer. This two-step sequence of "pulsing" precursor gases is repeated a number of times until a thin film of a single material at a desired thickness is achieved. In other versions of the ALD process, more than two precursor gas flows are used in sequence to generate the thin film. The introduction of each precursor gas to the reaction chamber may be preceded by the introduction of a purge gas to ensure that the previous precursor gas has been removed, thereby reducing or preventing unwanted deposition byproducts. Although providing excellent thickness control, the ALD process of producing alternating monolayers on the surface of the substrate is time intensive and significantly limits throughput.

SUMMARY OF THE INVENTION

In one aspect, the invention features an inline chemical vapor deposition method of fabricating a device. The method includes transporting a substrate through a deposition chamber having a vacuum environment and a first deposition module, a second deposition module and a third deposition module. A buffer layer is deposited onto the substrate during the transport of the substrate through the first deposition module. A window layer is deposited onto the buffer layer during the transport of the substrate through the second deposition module. A transparent conductive layer is deposited onto the window layer during the transport of the substrate through the third deposition module.

In another aspect, the invention features an inline chemical vapor deposition method of fabricating a device. The method includes transporting a substrate having a metal layer and an absorber layer at a constant rate through a deposition chamber having a vacuum environment and a first deposition module, a second deposition module and a third deposition module. Each deposition module includes at least one deposition station having a manifold that includes a first precursor port, a pair of second precursor ports and a pair of pumping ports. The first precursor port is disposed between the second precursor ports and the pair of second precursor ports is disposed between the pumping ports. The first precursor port and the pair of second precursor ports are configured for coupling to a first precursor gas source and a second precursor gas source, respectively. The pumping ports are configured to couple to a discharge system to exhaust the first and second precursor gases. The method further includes depositing a buffer layer onto the substrate during the transport of the substrate through the first deposition module, depositing a window layer onto the buffer layer during the transport of the substrate through the second deposition module and depositing a transparent conductive layer onto the window layer during the transport of the substrate through the third deposition module.

In yet another aspect, the invention features an inline chemical vapor deposition system that includes a deposition chamber, a continuous transport system and first, second and third deposition modules. The continuous transport system transports a substrate along a path through the deposition chamber. The first, second and third deposition modules are disposed on the path inside the deposition chamber. The first deposition module has at least one deposition station to deposit a buffer layer onto the substrate, the second deposition module has at least one deposition station to deposit a window layer onto the buffer layer and the third deposition module has at least one deposition station to deposit a transparent conductive layer onto the window layer. Each deposition module includes at least one deposition station having a manifold. Each manifold includes a first precursor port, a pair of second precursor ports and a pair of pumping ports. The first precursor port is disposed between the second precursor ports and the pair of second precursor ports is disposed between the pumping ports. The first precursor port and the pair of second precursor ports are configured for coupling to a first precursor gas source and a second precursor gas source, respectively. The pumping ports are configured to couple to a discharge system to exhaust the first and second precursor gases.

BRIEF DESCRIPTION OF THE DRAWINGS

The above and further advantages of this invention may be better understood by referring to the following description in conjunction with the accompanying drawings, in which like numerals indicate like structural elements and features in the various figures. For clarity, not every element may be labeled in every figure. The drawings are not necessarily to scale, emphasis instead being placed upon illustrating the principles of the invention.

FIG. 3A is a block illustration of the manifolds of the deposition stations of FIG. 1 integrated as a single structure according to an embodiment of the invention.

FIG. 3B is a top down view of the web substrate relative to the precursor ports and pump ports shown in FIG. 3A.

DETAILED DESCRIPTION

Figure 1:
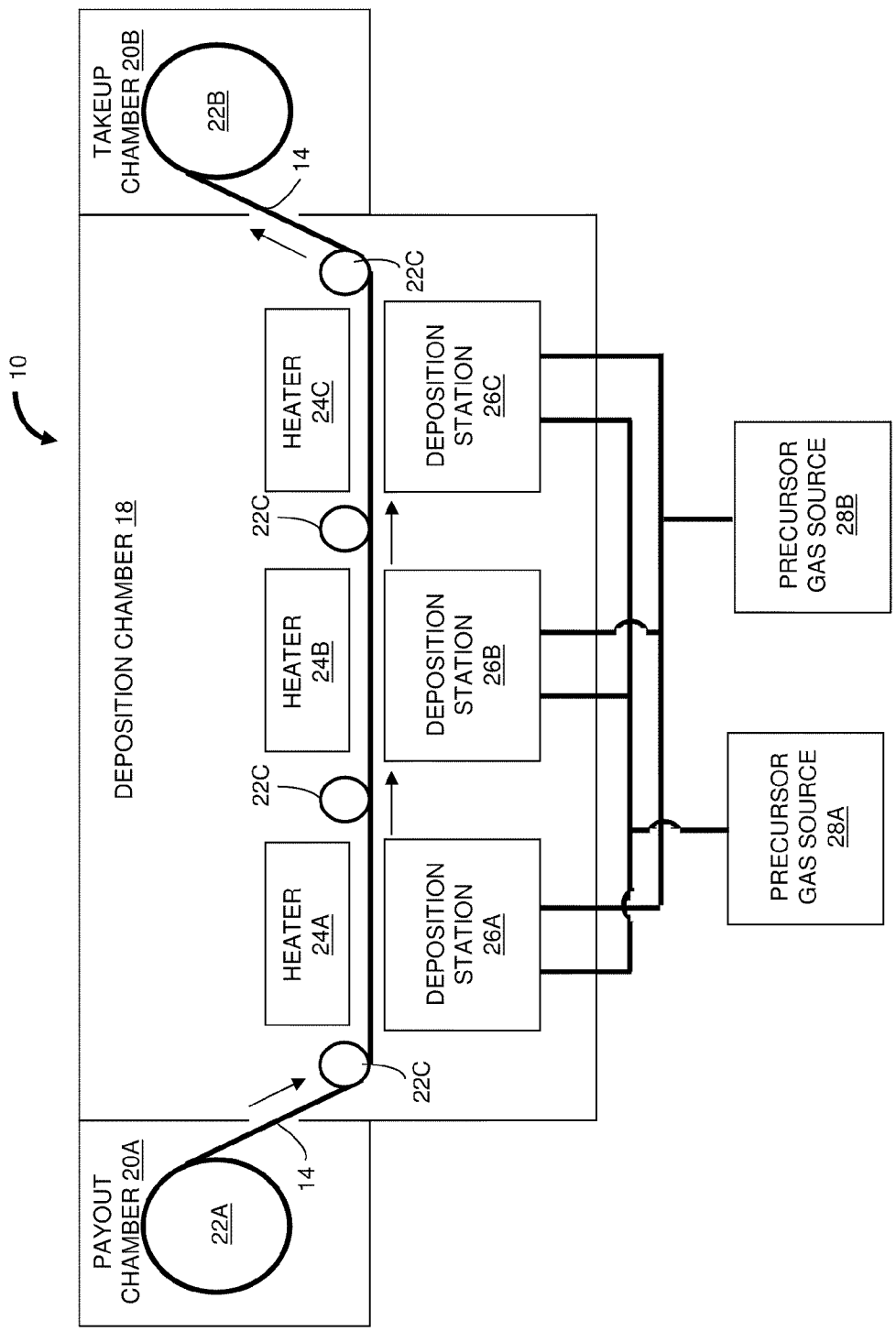
FIG. 1 is an illustration of an embodiment of an inline CVD system according to the invention.

The steps of the methods of the present invention can be performed in any order with operable results and two or more steps can be performed simultaneously unless otherwise noted. Moreover, the systems and methods of the present invention may include any of the described embodiments or combinations of the described embodiments in an operable manner.

The present teaching relates to systems and methods for reactive gas phase processing such as CVD, MOCVD and Halide Vapor Phase Epitaxy (HVPE) processes. In conventional reactive gas phase processing of semiconductor materials, semiconductor wafers are mounted in a carrier inside a reaction chamber. A gas distribution injector is configured to face the carrier. The injector typically includes gas inlets that receive a plurality of gases or combinations of gases. The injector directs the gases or combination of gases to the reaction chamber. Injectors commonly include showerhead devices arranged in a pattern that enables the precursor gases to react as close to each wafer surface as possible to maximize the efficiency of the reaction processes and epitaxial growth at the surface.

Some gas distribution injectors include a shroud to assist in providing a laminar gas flow during the CVD process. One or more carrier gases can be used to assist in generating and maintaining the laminar gas flow. The carrier gases do not react with the precursor gases and do not otherwise affect the CVD process. A typical gas distribution injector directs the precursor gases from the gas inlets to targeted regions of the reaction chamber where the wafers are processed. For example, in some MOCVD processes the gas distribution injector introduces combinations of precursor gases including metal organics and hydrides into the reaction chamber. A carrier gas such as hydrogen or nitrogen, or an inert gas such as argon or helium, is introduced into the chamber through the injector to help sustain a laminar flow at the wafers. The precursor gases mix and react within the chamber to form a film on the wafers.

In MOCVD and HVPE processes, the wafers are typically maintained at an elevated temperature and the precursor gases are typically maintained at a lower temperature when introduced into the reaction chamber. The temperature of the precursor gases and thus their available energy for reaction increases as the gases flow past the hotter wafers.

One common type of CVD reaction chamber includes a disc shaped wafer carrier. The carrier has pockets or structural features arranged to hold one or more wafers on a top surface of the carrier. During CVD processing, the carrier is rotated about a vertical axis that extends perpendicular to the wafer-bearing surface. Rotation of the carrier improves the uniformity of the deposited material. During rotation, the precursor gases are introduced into the reaction chamber from a flow inlet element above the carrier. The flowing gases pass downward toward the wafers, preferably in a laminar plug flow. As the gases approach the rotating carrier, viscous drag impels the gases into rotation about the axis. Consequently, in a boundary region near the carrier surface and wafers, the gases flow around the axis and outward toward the edge of the carrier. As the gases flow past the carrier edge, they flow downward toward one or more exhaust ports. Typically, MOCVD process are performed using a succession of different precursor gases and, in some instances, different wafer temperatures, to deposit a plurality of different layers each having a different composition to form a device.

CVD processes, such as MOCVD and HVPE, are typically limited in throughput capacity. Conventional systems and methods for CVD processing are often inadequate to support high volume processing of wafers and other discrete substrates and high speed processing of web substrates in roll-to-roll deposition systems without redundant equipment.

The systems and methods of the present invention are suitable for inline CVD processing of web substrates and discrete substrates. The systems and methods are particularly adapted for high-throughput processing in which a single layer is deposited on a substrate such as in the fabrication of solar cells and flat panel displays. In one example application, zinc oxide is deposited on a substrate to create solar cells. In another example application, indium tin oxide is deposited on a substrate as part of a fabrication process for flat panel displays. As used herein, a substrate can be a superstrate, that is, a supporting layer that is the first layer of a device to receive incident light. The system provides several advantages over conventional deposition systems. The quality of the deposited films is improved and the cost of the process equipment is reduced. Moreover, operating costs are lower due, in part, to more efficient material utilization. For example, material utilization is substantially greater than the utilization of target material in conventional sputtering systems.

FIG. 1 shows an embodiment of an inline CVD system 10 according to the present invention. The incline CVD system 10 includes a web transport system to transport a web substrate 14 through a deposition chamber 18 in a continuous manner. The web transport system includes a supply roller 22A and a receive roller 22B. The supply roller 22A is the source of the web substrate 14 to be processed. The receive roller 22B receives the web substrate 14 after deposition is complete and maintains the web substrate 14 in the form of a roll. Additional rollers 22C are disposed within the deposition chamber 18 between the supply roller 22A and the receive roller 22B to accurately control the path of the web substrate 14. The web transport system transports the web substrate 14 at a substantially constant rate along the path. Optionally, in order to keep the chamber walls clear from parasitic depositions, purge gases can be introduced at various chamber locations, or in the payout chamber 20A and takeup chamber 20B.

The deposition chamber 18 is maintained at a low pressure (e.g., a 1 torr LPCVD process) or at atmospheric pressure (e.g., an APCVD process) as known in the art. The deposition chamber 18 includes a plurality of deposition stations 26 disposed adjacent to the path of the web substrate 14. In the illustrated embodiment only three deposition stations 26 are shown for clarity although it will be recognized by those of skill in the art that the number of deposition stations 26 may be different. Each deposition station 26 includes a manifold that is coupled to a precursor gas source 28. Each deposition station 26 provides precursor gases in a laminar flow between the manifold and a nearest surface of the web substrate 14 so that the precursor gases react near the web surface to deposit a film. In some embodiments, one or more of the precursor gases in the laminar flow are energized using an RF power supply or microwave power supply according to a Plasma Enhanced CVD (PECVD) process as known in the art.

Unlike conventional MOCVD reaction chambers, the precursor gases are introduced underneath the substrate 14 in a reversed vertical direction of flow, that is, the gases flow upward toward the surface to be coated. Consequently, unwanted byproducts of the reaction of the precursor gases do not contaminate or otherwise interfere with the deposition process as would otherwise occur in a downward precursor gas flow configuration.

The deposition chamber 18 includes heaters to heat the web substrate 14 during the CVD process. In the illustrated embodiment, a heating module 24, such as a radiant heater, is positioned proximate to the web substrate 14 opposite each of the deposition stations 26 to heat the web substrate 14 to a desired process temperature. In an alternative embodiment, one or more heaters are in thermal contact with the web substrate 14. One of skill in the art will recognize that still other types of heaters can be used to heat the web substrate 14.

The path of the web substrate 14 is configured to pass by the manifolds of the deposition stations 26 in a serial manner so that a single layer of material of a desired thickness is deposited prior to the web substrate 14 arriving at the receive roller 22B. More specifically, a film of material is deposited on the web substrate 14 as it passes by a first deposition station 26A. Subsequently, the web substrate 14 passes by a second deposition station 26B and then a third deposition station 26C where a second film and a third film, respectively, of the material are deposited. Thus the thickness of the deposited layer of material at the receive roller 22B is the sum of the thicknesses of the individual films deposited by the deposition stations 26. In some embodiments, the deposition temperature, the gas phase composition or both the deposition temperature and gas phase composition at each deposition station 26 is varied from that of the other deposition stations 26 such that the resulting film properties are varied from the first deposited film to the next deposited film and so on to the last deposited film.

The deposition chamber 18 can be configured with one or more in-situ measurement devices to monitor the deposition layer as it is formed during the CVD process. In one embodiment, a measurement device is positioned after each deposition station 26 to characterize the deposition layer.

Figure 2A:
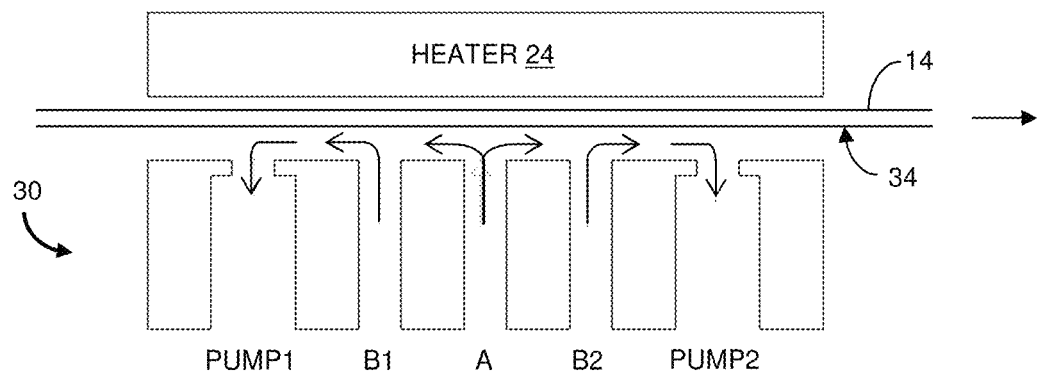
FIG. 2A illustrates a web substrate transported past a manifold of a deposition station according to an embodiment of the invention.

FIG. 2A shows the web substrate 14 passing from left to right between a heater 24 and a manifold 30 for one of the deposition stations 26 according to one embodiment. Each manifold 30 includes a precursor port (port "A") that is coupled to a source of a first precursor gas and a pair of precursor ports (ports "B1" and "B2") coupled to a source of a second precursor gas. The precursor gas ports are disposed between two pumping ports ("PUMP1" and "PUMP2"). The pumping ports are coupled to a discharge system to exhaust the precursor gases from the deposition chamber 18. The sources 28 of the precursor gases can be located proximate to the deposition chamber 18 or can be in a remote location. The material to be deposited during the CVD process can be changed by coupling the precursor ports to different precursor gases sources 28. Coupling can be performed manually at each manifold 30. Alternatively, reconfiguration of the precursor gases can be performed by remote activation of gas distribution valves. By way of specific examples, one precursor gas can be a zinc compound and the other precursor gas can be oxygen wherein the deposited layer comprises an aluminum, boron, indium, fluorine, silver, arsenic, antimony, phosphor, nitrogen, lithium, manganese or gallium-doped zinc oxide material used in the fabrication of flat panel displays, light-emitting diodes (LEDs), organic LEDs (OLEDs) and solar cells. To control bandgap and optical transmission wavelength cutoff, adhesion or other electrical properties, the zinc oxide can be alloyed with various concentrations of Mg, Cd, Be, Te, S and other elements.

During CVD processing, the web transport system moves the web substrate 14 over the deposition station 26 such that a nearest surface 34 of the web substrate 14 is adjacent to the precursor ports and the pumping ports. As used herein, the separation between the adjacent portion of the web substrate 14 and the ports of the deposition station is small, for example, between 0.3 cm and 5 cm. Preferably, the separation is between 0.5 cm and 1 cm. The first precursor gas flows upward from port A and then along the surface 34 through the separated region in a substantially laminar flow towards each of the pumping ports. The second precursor gas flows upward from precursor port B1 and then flows to the left along the surface 34, mixing with the portion of the first precursor gas flowing to the first pumping port PUMP1. Similarly, the second precursor gas flowing upward from precursor port B2 flows along the surface 34 to the right, mixing with the portion of the first precursor gas flowing to the second pumping port PUMP2.

The precursor gases mix and react with each other in the common flow areas prior to being removed through the pump ports PUMP. Thus there are two regions above the manifold 30 of each deposition station 26 where a reaction occurs and a film is deposited. Increasing the flow rate of the precursors gases generally results in an increase in the deposition rate. The web substrate 14 is continuously moving so that the entire web surface 34 passes through the two regions of each deposition station 26 during a CVD process run.

Advantageously, the precursor gases are confined to mixing near the surface 34 of the web substrate 14 before being exhausted so that reaction of the precursor gases is limited to a region near and at the surface 34. Thus reaction of the precursor gases in other regions of the deposition chamber is prevented and unwanted deposits and contamination are avoided.

Figure 2B:
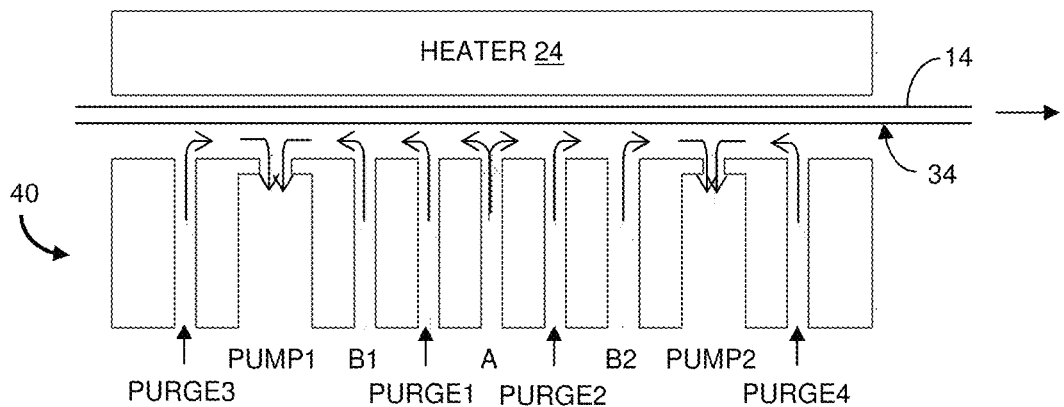
FIG. 2B illustrates a web substrate transported past a manifold of a deposition station according to another embodiment of the invention.

An alternative configuration of a manifold 40 according to another embodiment of the invention is shown in FIG. 2B. In this configuration, a first purge port "PURGE1" is provided between port A and port B1, and a second purge port "PURGE2" is provided between port A and port B2. Two additional purge ports "PURGE3" and "PURGE4" are disposed on the opposite sides of the pump ports. Each purge port provides a carrier gas that does not react with the precursor gases. The carrier gas assists in establishing and maintaining a uniform laminar flow of the precursor gases. The reaction between the two precursor gases occurs in regions of mixing in a similar manner to that described above for FIG. 2A.

Figure 2C:
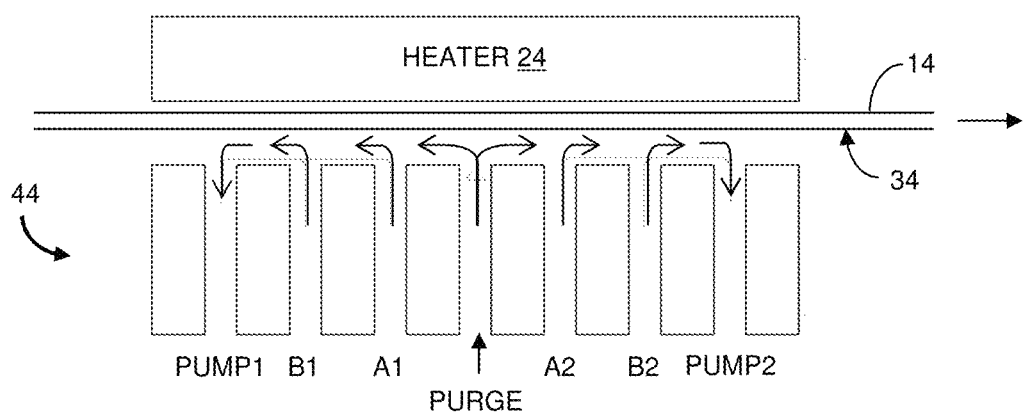
FIG. 2C illustrates a web substrate transported past a manifold of a deposition station according to another embodiment of the invention.

FIG. 2C shows a configuration of a manifold 44 according to yet another embodiment of the invention. In this configuration, a single purge port "PURGE" is the central port of the manifold 44. A first pair of precursor gas ports A1 and A2 surrounds the purge port and provides the first precursor gas for the laminar flow. A second pair of precursor gas ports B1 and B2 surrounds the purge port and the first precursor gas ports A1 and A2, and provides the second precursor gas for the laminar flow.

FIG. 3A is a diagram of the manifolds of the deposition stations 26 of FIG. 1 integrated as a single structure according to an embodiment of the invention. Each manifold 30 is configured as described above for FIG. 2A except that adjacent pump ports of adjacent manifolds 30 are combined as a single pump port. FIG. 3B is a top down view of the web substrate 14 as it passes over the precursor gas ports and the pump ports shown in FIG. 3A. Dashed rectangles indicate the location of the ports beneath the web substrate 14.

Each precursor port and each pump port has a rectangular shape with a length L that is slightly greater than a width W of the web substrate 14 so that the deposited layer extends to the edge of the web substrate 14. For each manifold 30 there is one region A+B in which the two precursor gases are mixed in a laminar flow to the left and a second region A+B in which the two precursor gases are mixed in a laminar flow to the right. As the web substrate 14 travels in a left to right direction, the deposition layer is applied incrementally by each region of mixed precursor gases. Preferably, the flow rate of the gases exiting each precursor gas port is constant along the length L of the port to minimize variations in the ratio of the precursor gases within the mixed regions of laminar flow to thereby minimize nonuniformity in the deposited layer.

In the illustrated embodiment, each manifold 30 has a "B-A-B" precursor gas port sequence configuration, that is, a precursor gas port B is disposed on each side of a single precursor gas port A. In alternative embodiments, one or more of the manifolds has an "A-B-A" precursor gas port configuration. In other words, for at least one of the manifolds, the sequence of precursor gases provided at the gas ports is "inverted."

Figure 4A:
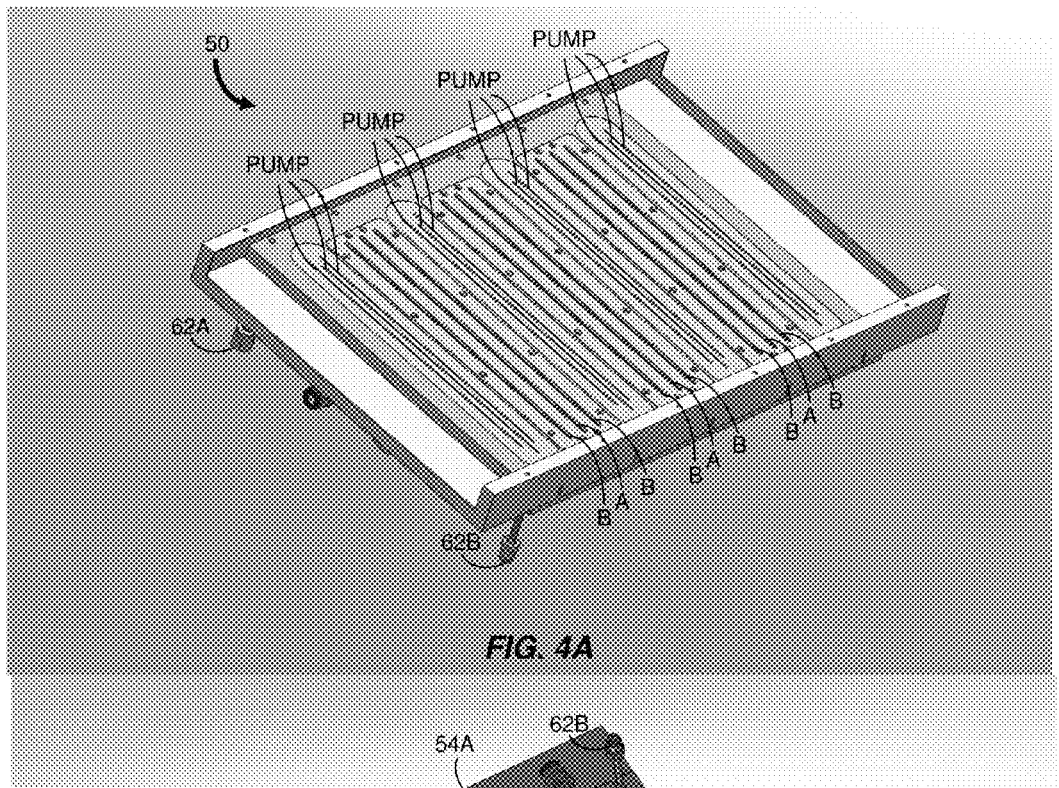
FIG. 4A is a top perspective view of an embodiment of an integrated deposition station module according to the invention.
Figure 4B:
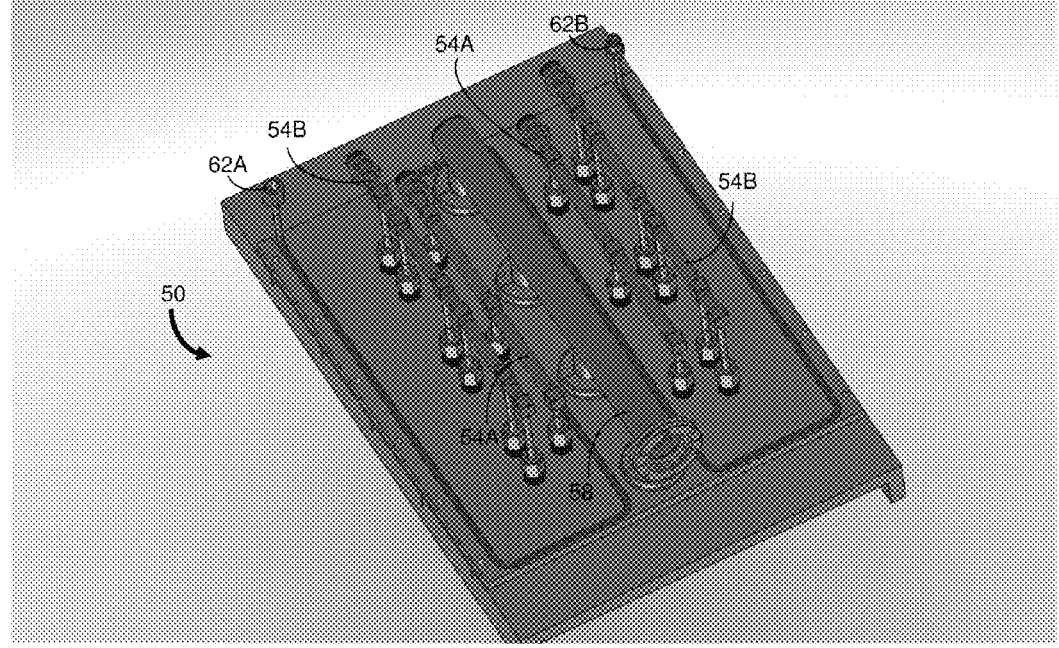
FIG. 4B is a bottom perspective view of the integrated deposition station module shown in FIG. 4A.
Figure 4C:
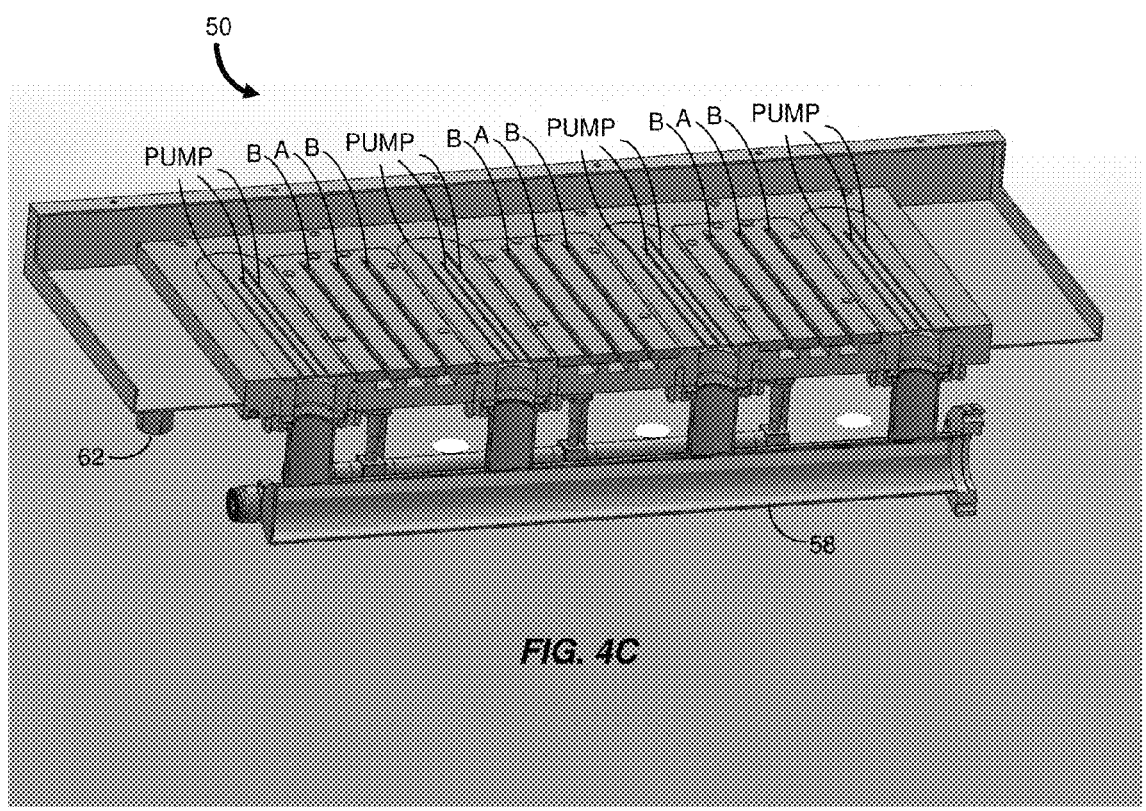
FIG. 4C is a cutaway view of the integrated deposition station module shown in FIG. 4A.

FIG. 4A and FIG. 4B are a top perspective view and a bottom perspective view, respectively, of an embodiment of an integrated deposition station module 50. FIG. 4C is a cutaway view of the module 50. The module 50 includes three deposition stations 26 integrated as a single structure. The manifolds are configured in a similar arrangement to those shown in FIG. 3A except that each pump port "PUMP" comprises three closely-spaced narrow slots instead of a single slot.

Each precursor gas port A or B is supplied by a pair of gas channels 54A or 54B, respectively, on the bottom of the module 50 that are orthogonal to the length of the ports. A single pump exhaust plenum 58 along the bottom of the module 50 is coupled in each of four places to the three slots of a single pump port. The narrow slots of the pump port enable a pressure differential to be maintained between the outside and the inside of the pump exhaust plenum 58. Consequently, pumping is uniform along the length of the slots and an improved laminar flow is achieved.

Figure 5:
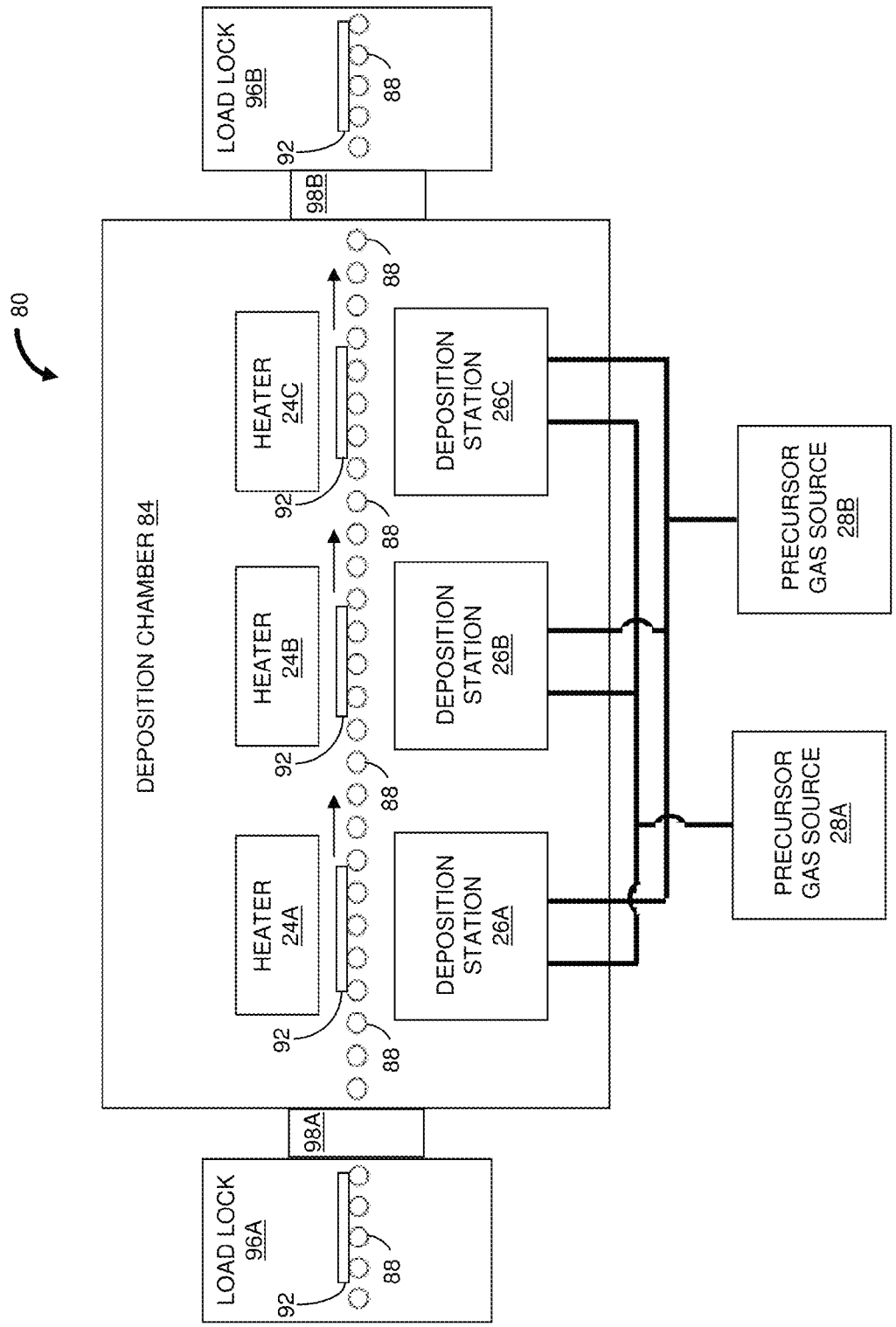
FIG. 5 is an illustration of another embodiment of an inline CVD system according to the invention.

FIG. 5 illustrates another embodiment of an inline CVD system 80 according to the present invention. The CVD system 80 includes a continuous substrate transport system to transport discrete substrates 92 through a deposition chamber 84. For example, the discrete substrates 92 can be sheets of glass or wafers, such as semiconductor wafers. The CVD system 80 can be used to process semiconductor wafers in the manufacture of solar cells and devices.

The discrete substrates 92 are loaded onto the substrate transport system at atmospheric pressure. The substrate transport system includes a plurality of rollers 88 that directly support the substrates 92 as they pass through the inline CVD system 80 while maintaining the desired position of each substrate 92 with respect to the other substrates 92 and system components. Alternatively, carriers are used to transport the substrates 92 with each carrier holding one or more substrates 92 and having one or more openings each with a small lip that extends continuously around the opening or that is in the form of pins. For example, a carrier can be configured as one or more "picture frames" where a substrate 92 is held in each frame by gravity. The substrates 92 are placed onto the rollers 88 or into the carriers using one or more robotic systems or other automated mechanisms as known in the art. In one embodiment, the rollers 88 are operated synchronously and continuously such that the transport rate of the substrates 92 is constant throughout the inline CVD system. In another embodiment, rollers 88 or groups of rollers 88 are independently controlled. For example, the rollers 88 in the load lock chambers 96 described below can be operated continuously or intermittently at one rotation rate while the rollers in the deposition system are operated at a different rotation rate. The position of the groups of rollers 88 in the load lock chambers 96 and the groups adjacent to the deposition stations 24 are closely spaced to each other so that the "hand off" to the next group of rollers 88 occurs in a smooth and stable manner. In other embodiments, the continuous substrate transport system uses other mechanisms known in the art for controlling the position of the discrete substrates 92 throughout the inline CVD system. For example, the continuous substrate transport system can include one or more controllable lead screw mechanisms.

Preferably, the walls of the deposition chamber 84 are maintained clear from parasitic depositions by purge gases introduced at various locations in the chamber 84. Purge gases can also be used to keep the rollers 88 clean during CVD process runs.

The discrete substrates 92 pass through a first load lock chamber, or isolation chamber, 96A before entering the deposition chamber 84. The load lock chamber 96A, in combination with a gate valve 98A, provides a pressure interface between atmospheric pressure where the discrete substrates 92 are loaded onto the substrate feed mechanism and the vacuum environment of the deposition chamber 84. In one embodiment, the load lock chamber 96A maintains a pressure that is less than atmospheric pressure and greater than the vacuum level of the deposition chamber 84. In another embodiment, the load lock chamber 96A is coupled to a source of a purge gas and a vacuum pump so that a pump and purge cycle can be repeated during CVD processing.

The substrate feed mechanism transports the discrete substrates 92 through the deposition chamber 184 so that each substrate 92 passes in close proximity to a plurality of deposition stations 26 and heaters 24 in a sequential manner similar to that described above for the web substrate 14 of FIG. 1. The deposition stations 26 include manifolds coupled to precursor gas sources 28 and configured to provide at least two precursor gases in a laminar flow between each manifold and a surface of a discrete substrate 92. Thus the precursor gases react to deposit a layer on the substrate surface. Optionally, the precursor gases are energized using an RF power supply to enable a PECVD process as known in the art to be performed. The discrete substrates 92 pass by the deposition stations 26 in a sequential manner so that a layer of material of a desired thickness is deposited by the time the substrates are past the last deposition station 26C.

After completion of the deposited layer, the processed substrates 92 exit the deposition chamber 84 and enter an output load lock, or isolation chamber, 96B. The load lock chamber 96B and gate valve 98B perform as a pressure interface between atmospheric pressure at the unloading station and the vacuum environment of the deposition chamber 84. In one embodiment, the load lock chamber 96B operates at a pressure that is between atmospheric pressure and the pressure of the deposition chamber 84. In another embodiment, the load lock chamber 96B is coupled to a source of a purge gas and a vacuum pump to enable a pump and purge cycle to be performed during CVD processing. After exiting the load lock chamber 96B, the discrete substrates 92 pass to an unloading station (not shown) where they are removed from the continuous substrate feed mechanism using one or more robotic systems or automated mechanisms as known in the art.

In the system embodiments described above and in other embodiments of an inline CVD system according to the present invention, process parameters such as precursor gas flow rates, substrate temperature and transport rate, pump exhaust rate and deposition chamber pressure can be controlled to define the thickness and other characteristics of the deposited material. The CVD system is adaptable for a variety of applications and is appropriate for single layer deposition in high volume throughput environments.

A method for inline CVD processing according to an embodiment of the present teaching can be performed using the system of FIG. 1 or FIG. 5. The method includes providing a first flow of a first precursor gas (A) in a first direction along a surface of a substrate (e.g., web substrate 14 or discrete substrate 92) and providing a second flow of the first precursor gas (A') in a second direction along the surface of the substrate. A first flow of a second precursor gas (B) is provided in the first direction along the surface of the substrate to mix with the first flow of the first precursor gas (A). A second flow of the second precursor gas (B') is provided in the second direction along the surface of the substrate to mix with the second flow of the first precursor gas (A'). The substrate is continuously transported in the second direction so that a surface of the substrate is first exposed to the mixed first flows of the first and second precursor gases (A and B) and subsequently exposed to the mixed second flows of the first and second precursor gases (A' and B').

Preferably, the substrate is transported at a constant rate through the CVD process. In some embodiments, the substrate is heated during the deposition process. In other embodiments, the method also includes providing a first flow of a carrier gas in the first direction and a second flow of the carrier gas in the second direction. The carrier gas comprises a gas that does not react with the precursor gases and assists in maintaining a uniform laminar flow of the precursor gases over a portion of the surface that receives the deposition layer.

The inline CVD method of the invention in which a material is deposited on the substrate in an incremental and sequential manner enables a high throughput of a CVD processed web substrate or a high volume output of CVD processed discrete substrates. The composition of the film deposited at each deposition station 26 is substantially identical to the films deposited at the other deposition stations 26. Various process parameters such as the transport rate, precursor gas flow rates and substrate temperature can be controlled to achieve a high quality deposited layer of a desired thickness.

Figure 6:
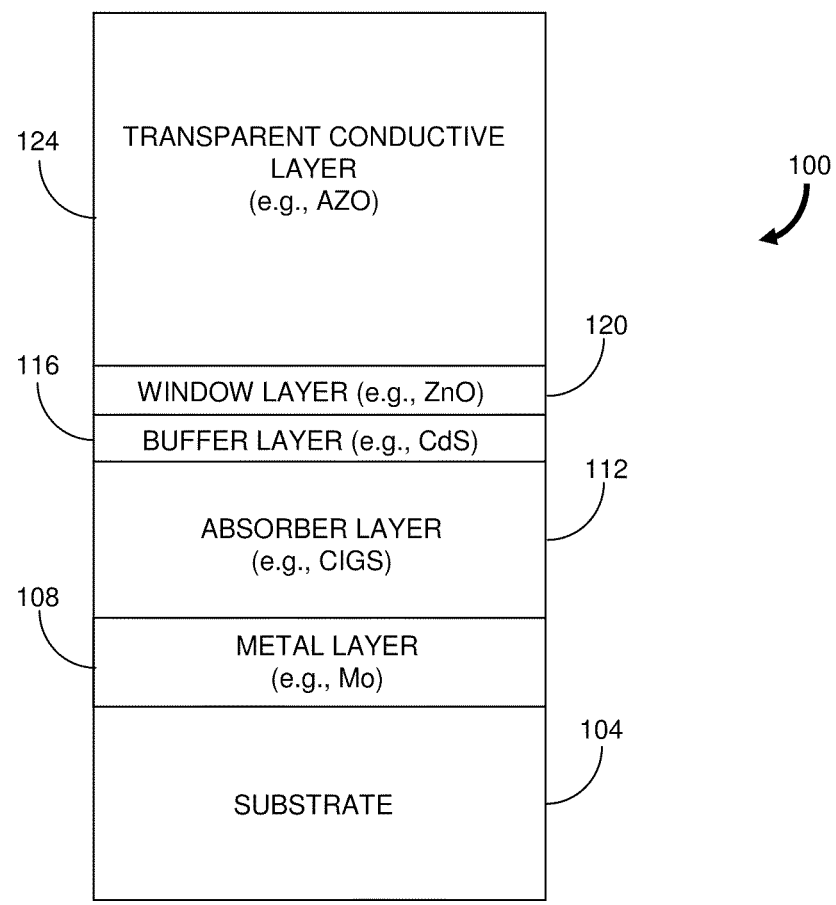
FIG. 6 is an illustration of an example of a device structure that can be achieved using embodiments of an inline CVD method according to the invention.

Other methods for inline CVD processing according to embodiments of the present teaching can be performed to manufacture devices such as solar cells having the device structure illustrated in FIG. 6. The device 100 includes a substrate 104 which can be a discrete substrate or a flexible web substrate. By way of examples, the discrete substrate can be a glass substrate or wafer and the web substrate can be a polyimide or metal foil. The device 100 further includes a metal layer 108 such as a molybdenum layer, an absorber layer 112 such as a copper indium gallium diselenide (CIGS) layer, a buffer layer (or junction partner) 116, a window layer 120 and a transparent conductive layer 124. For example, the buffer layer 116 can be a cadmium sulfide (CdS) layer, a zinc sulfide (ZnS) layer or an indium sulfide (InS) layer, the window layer 120 can be an intrinsic zinc oxide (ZnO) layer and the transparent conductive layer 124 can be an indium tin oxide layer or a doped ZnO layer such as an aluminum-doped zinc oxide (AZO) layer, a boron-doped zinc oxide (BZO) layer or a gallium-doped zinc oxide (GZO) layer.

Using conventional techniques, the buffer layer 116 is a thin layer (e.g., 50 nm) typically generated using a chemical bath deposition (CBD) process and the thin ZnO layer 120 (e.g., 50 nm) and transparent conductive layer 124 typically deposited using CVD processes. More specifically, the device during fabrication typically passes from a CBD process to a first CVD process and then a second CVD process. Such techniques are generally time-intensive as the CBD and the two CVD process steps are performed independently.

According to embodiments of a CVD method for inline fabrication of a device based on principles of the invention, the process steps for generating the buffer layer, window layer and transparent conductive layer are performed sequentially in a common vacuum environment of a deposition chamber. The CBD deposition of the buffer layer is unnecessary and the three distinct layers are deposited without the need to transfer between different chambers. Thus there is no need to return to atmosphere between the different CVD deposition processes.

Figure 7:
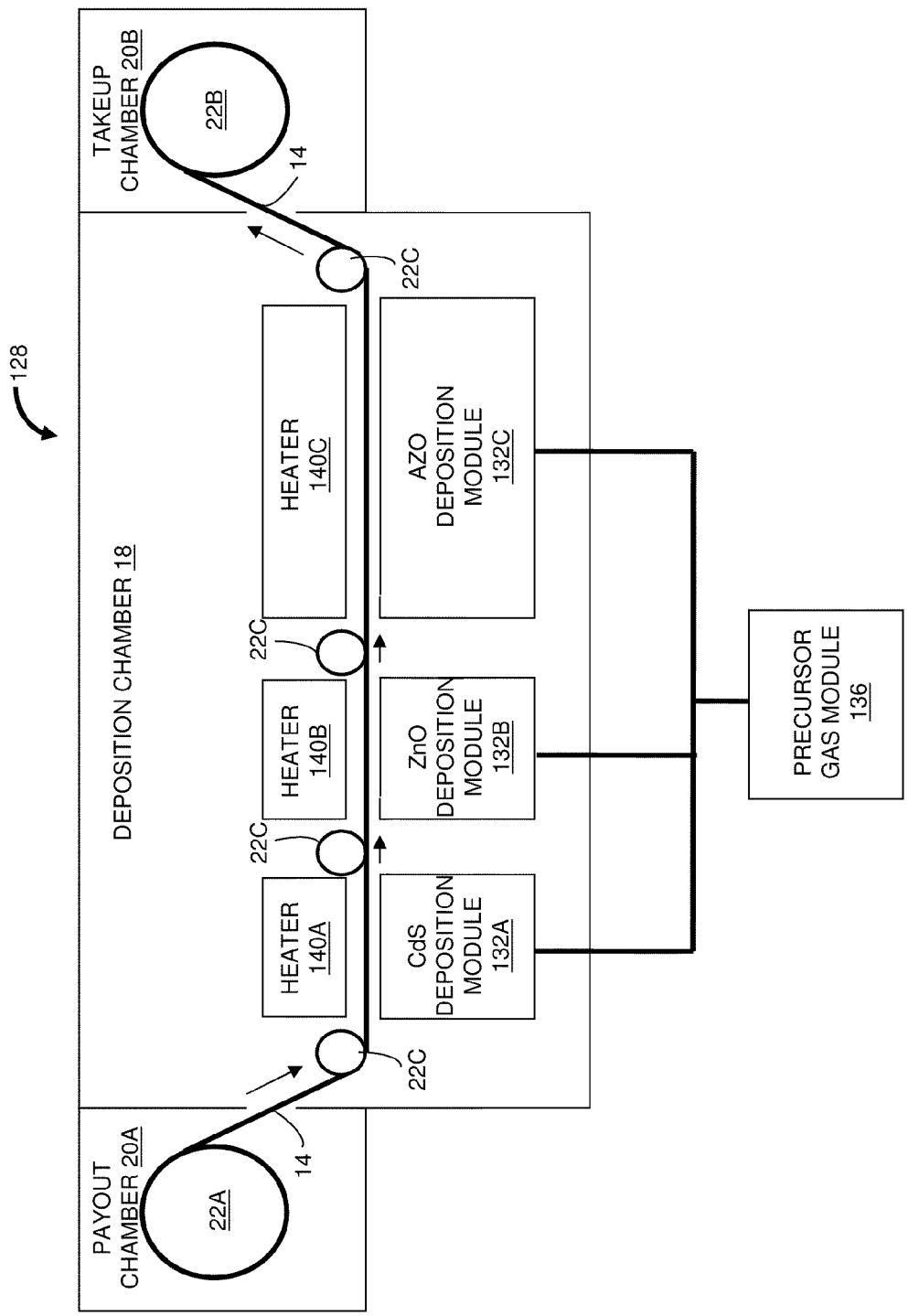
FIG. 7 is an illustration of another embodiment of an inline CVD system according to the invention.

FIG. 7 shows an embodiment of an inline CVD system 128 for fabrication of a solar cell device on a web substrate 14. The inline CVD system 128 includes components that are similar to those described above with respect to the inline CVD system 10 of FIG. 1; however, a group of deposition stations 26 used to generate a single layer of material is represented by a single deposition module 132. For example, each deposition module 132 can include one or more manifolds, such as the manifold of FIGS. 4A to 4C, coupled to sources of precursor gases in a precursor gas module 136 to deposit a specific layer of material. Each deposition module 132 deposits a layer of material that is different from the layers of materials deposited by the other deposition modules 132. A heating module 140 is positioned proximate to the web substrate 14 opposite each manifold or group of manifolds in each deposition module 132 to heat the web substrate 14 to a desired process temperature.

In the illustrated embodiment, the system 128 is configured to fabricate a device similar to the device 100 of FIG. 6. More specifically, the first deposition module 132A is configured to deposit a CdS buffer layer, the second deposition module 132B is configured to deposit an intrinsic ZnO layer and the third deposition module 132C is configured to deposit an AZO layer. The number of manifolds, the precursor gas flow rates to the manifolds and the web substrate temperature can vary among the deposition modules 132 in order to achieve the desired thickness of the respective layer deposited by each deposition module 132. For example, the third deposition module 132C is shown as having a greater length (representing a greater number of manifolds) than the first two deposition modules 132A and 132B due to the substantially greater thickness of the AZO layer in comparison to the CdS buffer layer and the intrinsic ZnO layer.

The system 128 can be reconfigured to produce device structures having different material layers by changing precursor gases provided to one or more of the deposition modules 132 and by modifying other process parameters such as the web transport rate, substrate temperature, manifold pump exhaust rate and deposition chamber pressure. By way of specific examples, other CIGS solar cell devices can be fabricated with the first deposition module 132A configured to deposit a ZnS layer or an InS layer, and the third deposition module 132C configured to deposit a GZO layer or a BZO layer. The system 128 can be configured to produce other device layer structures such as a barrier layer (e.g., $SiO_2$ or $Al_2O_3$) between a substrate and a back (molybdenum) contact. This structure on a glass plate substrate prevents an uncontrolled flow of sodium from the glass. A controlled dose of sodium is then produced on top of the barrier layer. The system 128 can also be adapted to produce structures having fluorinated ZnO or tin oxide ($SnO_2$) as a transparent conductive layer for amorphous silicon.

Figure 8:
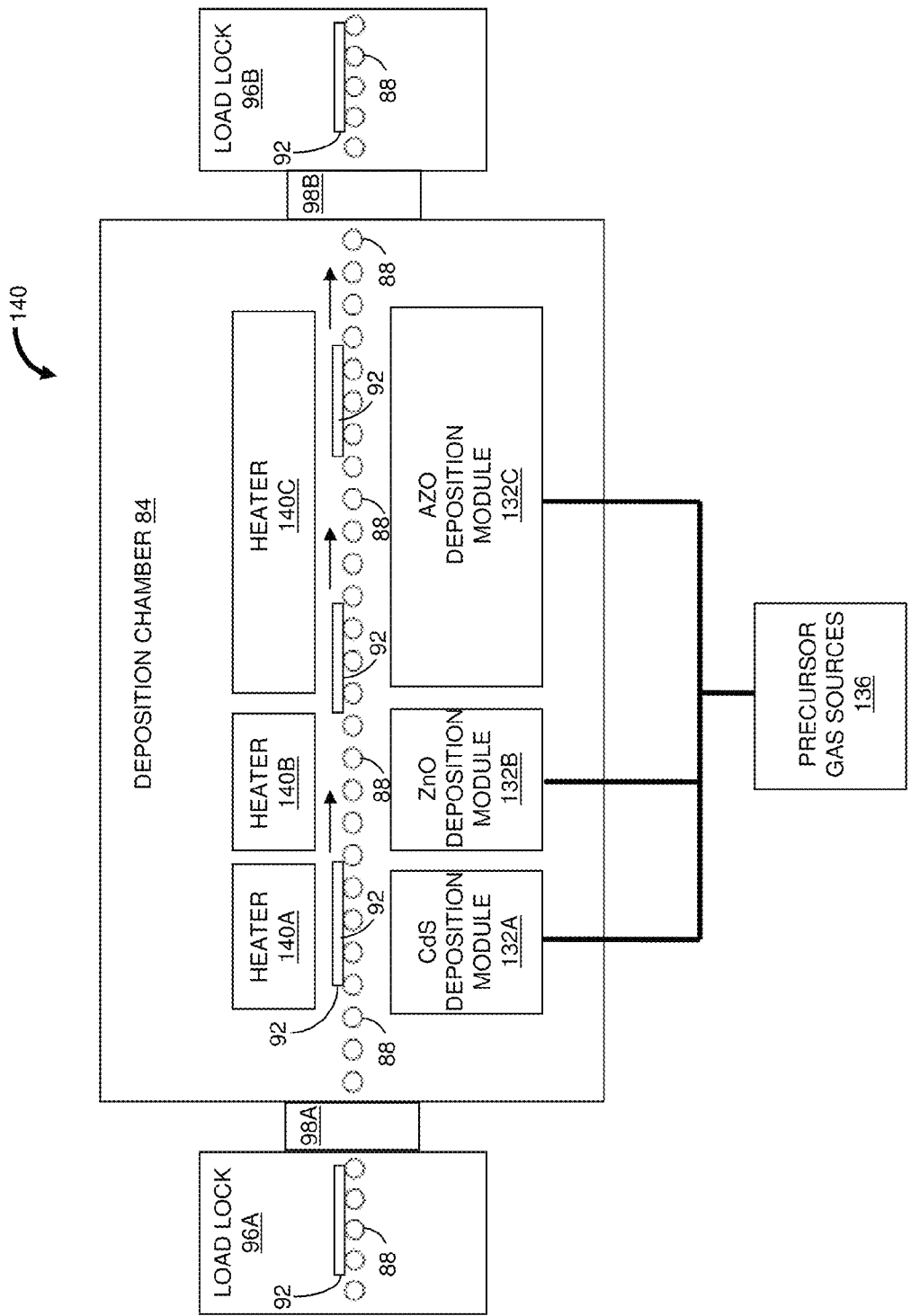
FIG. 8 is an illustration of another embodiment of an inline CVD system according to the invention.

FIG. 8 shows an inline CVD system 140 adapted for fabrication of a solar cell device on a discrete substrate 92. The inline CVD system 140 includes components that are similar to those described above with respect to the inline CVD system 80 of FIG. 5; however, each group of deposition stations 26 that deposits a common material is represented by a single deposition module 132. The system 140 is configured so that the discrete substrates 92 receive three layers similar to those deposited onto the web substrate 14 in the system 128 of FIG. 7. The number of manifolds per deposition station 132, the types and flow rates of the precursor gases, the substrate temperatures, the transport rate and other process parameters can be selected so that different material layers and layer thicknesses can be obtained.

Advantageously, the systems 128 and 140 of FIGS. 7 and 8 enable devices to be generated by successive CVD deposition processes all occurring in a single deposition chamber. As a result, fabrication time and costs are reduced compared to conventional techniques used to generate similar devices.

Figure 9:
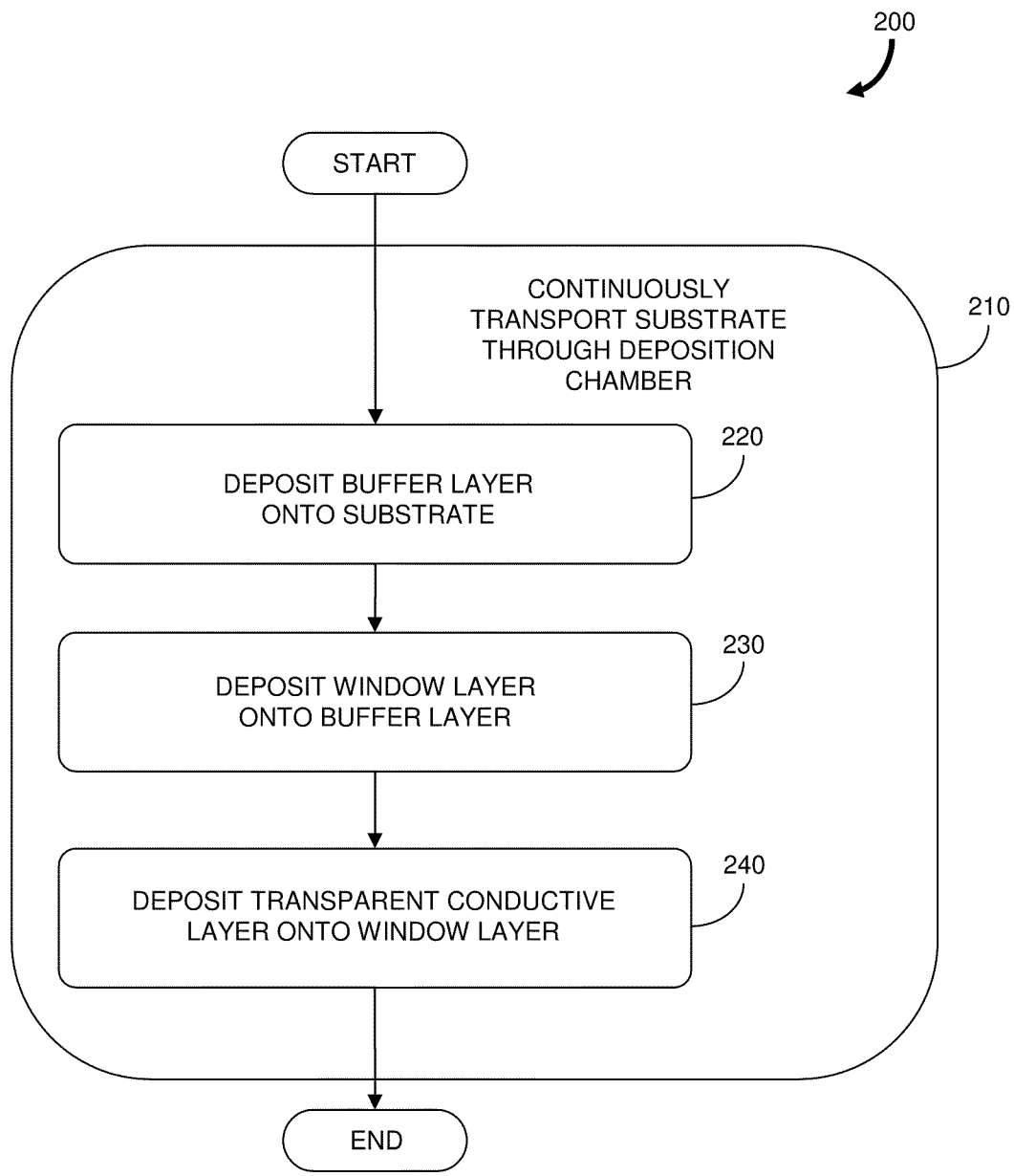
FIG. 9 is a flowchart representation of an embodiment of an inline CVD method of fabricating a device.

FIG. 9 is a flowchart representation of an embodiment of an inline CVD method 200 of fabricating a device. Referring also to FIGS. 6 and 8, the method 200 includes transporting (step 210) a substrate 92 (104 in FIG. 6) at a constant rate through the deposition chamber 84. The substrate 92 may include the metal layer 108 and absorber layer 112 shown in FIG. 6. A buffer layer 116 is deposited (step 220) onto the substrate 92 during passage through the first deposition module 132A. A window layer 120 is deposited (step 230) onto the buffer layer 116 while the substrate is transported through the next deposition module 132B and a transparent conductive layer 124 is deposited (step 240) onto the window layer 120 while the substrate 92 is transported through the third deposition module 132C. The buffer layer 116, window layer 120 and transparent conductive layer 124 can any of a variety of materials such as those described above with regards to fabrication using the inline CVD systems of FIGS. 7 and 8.

Although the method 200 is described with respect to the processing of discrete substrates 92 according to the system 140 of FIG. 8, other embodiments of an inline CVD method of fabricating a device according to the principles of the invention will be recognized. For example, a complementary embodiment to the method 200 of FIG. 9 is directed to the fabrication of devices on a web substrate, for example, using the system 128 of FIG. 7.

While the invention has been shown and described with reference to specific embodiments, it should be understood by those skilled in the art that various changes in form and detail may be made therein without departing from the spirit and scope of the invention as recited in the accompanying claims.

What is claimed is:

1. An inline chemical vapor deposition method of fabricating a device, the method comprising:

transporting a substrate having a metal layer and an absorber layer at a constant rate through a deposition chamber having a vacuum environment and a first deposition module, a second deposition module and a third deposition module, each of the deposition modules comprising at least one deposition station having a manifold comprising a first precursor port, a pair of second precursor ports and a pair of pumping ports, the first precursor port disposed between the second precursor ports and the pair of second precursor ports disposed between the pumping ports, the first precursor port and the pair of second precursor ports configured for coupling to a first precursor gas source and a second precursor gas source, respectively, the pumping ports configured to couple to a discharge system to exhaust a mixed flow of the first and second precursor gases;

providing an upward flow of a first precursor gas from the first precursor port and an upward flow of a second precursor gas from the pair of second precursor ports of the first deposition module;

changing the upward flows of the first and second precursor gases of the first deposition module to a mixed laminar flow of the first and second precursor gases along a surface of the substrate to form a buffer layer onto the substrate during the transport of the substrate through the first deposition module;

after transport through the first deposition module, providing an upward flow of a first precursor gas from the first precursor port and an upward flow of a second precursor gas from the pair of second precursor ports of the second deposition module;

changing the upward flows of the first and second precursor gases of the second deposition module to a mixed laminar flow of the first and second precursor gases along the surface of the substrate to form a window layer onto the buffer layer during the transport of the substrate through the second deposition module;

after transport through the second deposition module, providing an upward flow of a first precursor gas from the first precursor port and an upward flow of a second precursor gas from the pair of second precursor ports of the third deposition module; and changing the upward flows of the first and second precursor gases of the third deposition module into a mixed laminar flow of the first and second precursor gases along the surface of the substrate to form a transparent conductive layer onto the window layer during the transport of the substrate through the third deposition module.

2. The method of claim 1 wherein the absorber layer comprises a copper indium gallium diselenide layer.

3. The method of claim 1 wherein the substrate is a discrete substrate.

4. The method of claim 3 wherein the discrete substrate is a glass substrate.

5. The method of claim 3 wherein the discrete substrate is a wafer.

6. The method of claim 3 wherein transporting the discrete substrate through the deposition chamber comprises transporting a plurality of discrete substrates through the deposition chamber and wherein each of the first, second and third deposition modules simultaneously provides a flow of precursor gases to one of the discrete substrates.

7. The method of claim 1 wherein the substrate is a web substrate.

8. The method of claim 1 wherein the buffer layer comprises one of a cadmium sulfide layer, a zinc sulfide layer and an indium sulfide layer.

9. The method of claim 1 wherein the window layer comprises an intrinsic zinc oxide layer.

10. The method of claim 1 wherein the transparent conductive layer comprises one of an aluminum-doped zinc oxide layer, a gallium-doped zinc oxide layer, a boron-doped zinc oxide layer and an indium tin oxide layer.

* * * * *